(12) United States Patent
Dessart et al.

(10) Patent No.: US 11,766,734 B2
(45) Date of Patent: Sep. 26, 2023

(54) WELDING CARTS WITH TOOL-LESS SECURING SYSTEMS

(71) Applicant: ILLINOIS TOOL WORKS INC., Glenview, IL (US)

(72) Inventors: Nicholas James Dessart, Neenah, WI (US); Chancelor D. Wyatt, Somerset, NJ (US)

(73) Assignee: ILLINOIS TOOL WORKS INC., Glenview, IL (US)

( * ) Notice: Subject to any disclaimer, the term of this patent is extended or adjusted under 35 U.S.C. 154(b) by 919 days.

(21) Appl. No.: 16/659,682

(22) Filed: Oct. 22, 2019

(65) Prior Publication Data
US 2021/0114133 A1 Apr. 22, 2021

(51) Int. Cl.
*B23K 9/32* (2006.01)
*B23K 37/02* (2006.01)
(Continued)

(52) U.S. Cl.
CPC ............ *B23K 9/32* (2013.01); *B23K 37/0205* (2013.01); *H05K 5/0221* (2013.01); *H05K 7/1432* (2013.01)

(58) Field of Classification Search
CPC .. B23K 37/0205; B23K 37/0294; B23K 9/10; B23K 9/16; B23K 9/32; H05K 5/0221;
(Continued)

(56) References Cited

U.S. PATENT DOCUMENTS

| 1,226,419 A | 5/1917 | Turner |
| 1,528,364 A | 3/1925 | Brown |

(Continued)

FOREIGN PATENT DOCUMENTS

| JP | 2006224707 | 8/2006 |
| KR | 101392065 | 5/2014 |
| WO | 2018010796 | 1/2018 |

OTHER PUBLICATIONS

Interational Searching Authority, "International Search Report and Written Opinion," issued in connection with International Patent Application No. PCT/US2019/023189, dated Jul. 16, 2019, 12 pages.

(Continued)

*Primary Examiner* — Dana Ross
*Assistant Examiner* — James F Sims, III
(74) *Attorney, Agent, or Firm* — McAndrews, Held & Malloy, Ltd.

(57) ABSTRACT

Welding carts with tool-less securing systems are disclosed. In some examples, a welding cart may be configured to retain and/or transport a welding-type power supply. The cart and power supply may have bracket holes configured to receive bracket ends of a securing bracket. The bracket ends may be received by the bracket holes when a shaft retaining the securing bracket is engaged with a rotational lock of the cart. An actuator connected to the shaft may be configured to rotate the shaft to engage the rotational lock. A resilient member may bias the bracket ends out of the bracket holes when the shaft is disengaged from the rotational lock. A captive fastener attached to the shaft may ensure that the shaft and bracket remain captive to the cart even when the shaft is disengaged from the rotational lock and/or the securing bracket is biased away from the cart.

20 Claims, 11 Drawing Sheets

(51) Int. Cl.
*H05K 5/02* (2006.01)
*H05K 7/14* (2006.01)

(58) Field of Classification Search
CPC .... H05K 7/1432; A47B 57/404; A47B 57/44;
A47B 96/063; A47B 96/065; A47B
96/14; A47B 96/1416
USPC ........ 280/515; 70/38 A, 308, 451; 248/48.2,
248/65, 220.21, 220.22, 518, 534
See application file for complete search history.

(56) References Cited

U.S. PATENT DOCUMENTS

| | | | |
|---|---|---|---|
| 2,253,403 | A | 8/1941 | Steinert |
| 4,505,501 | A | 3/1985 | Fuchs et al. |
| 5,730,891 | A | 3/1998 | Karpoff et al. |
| 10,046,411 | B2* | 8/2018 | Dessart .................. B23K 9/327 |
| 10,840,850 | B1* | 11/2020 | Atia ........................ F24S 25/15 |
| 2005/0103823 | A1 | 5/2005 | Domschot |
| 2013/0071179 | A1 | 3/2013 | Mugg |
| 2014/0069906 | A1 | 3/2014 | Dessart et al. |
| 2014/0263244 | A1 | 9/2014 | Delisio |
| 2015/0314814 | A1* | 11/2015 | Pulleyblank ........... B62D 33/02 |
| | | | 296/183.1 |
| 2017/0129035 | A1 | 5/2017 | Westlake et al. |
| 2017/0349039 | A1 | 12/2017 | Rayner |
| 2019/0217426 | A1 | 7/2019 | Dekker |
| 2019/0299341 | A1 | 10/2019 | Dessart et al. |

OTHER PUBLICATIONS

Europe Patent Office, Extended European Search Report, Application No. 20197919.2, dated Apr. 7, 2021, 6 pages.

* cited by examiner

WELDING CARTS WITH TOOL-LESS SECURING SYSTEMS

TECHNICAL FIELD

The present disclosure generally relates to welding carts and, more particularly, to welding carts with tool-less securing systems.

BACKGROUND

Welding power supplies sometimes need to be moved (and/or transported, repositioned, etc.) within a work area or to a different work area. Moving welding power supplies by hand can be awkward, as the power supplies may be bulky and/or heavy. Further, there may be environmental obstructions (e.g. wires, cords, equipment, debris, personnel, holes, etc.) that an operator may wish to avoid when moving the power supply. This may make it cumbersome and/or difficult to transport the power supply by hand. Thus, welding carts may be used to transport the welding power supplies.

BRIEF SUMMARY

Apparatus and systems are provided for tool-less securement of welding-type power supplies to welding carts, substantially as shown in and/or described in connection with at least one of the figures, as set forth more completely in the claims.

These and other advantages, aspects and novel features of the present invention, as well as details of an illustrated example thereof, will be more fully understood from the following description and drawings.

Preferred examples of the present disclosure may be described hereinbelow with reference to the accompanying figures. The figures are not necessarily to scale. Where appropriate, the same or similar reference numerals are used in the figures to refer to similar or identical elements. For example, reference numerals utilizing lettering (e.g., right sidewall 108a, left sidewall 108b) refer to instances of the same reference numeral that does not have the lettering (e.g., sidewalls 108)

DETAILED DESCRIPTION OF THE INVENTION

In the following description, well-known functions or constructions may not described in detail because they may obscure the disclosure in unnecessary detail.

Some examples of the present disclosure relate to a tool-less securing system configured to secure a welding-type power supply to a welding cart. In some examples, the securing system may comprise a securing bracket configured to be received by bracket holes of the power supply and welding cart. The securing bracket may further be retained on a shaft that is configured to engage a rotational lock of the welding cart when the securing bracket is aligned with the bracket holes.

An actuator may be connected to the shaft so that an operator may engage and/or disengage the shaft and rotational lock by hand, and without the use of any additional tools. A captive fastener may be provided to keep the shaft captive to the rotational lock even when the shaft and rotational lock are disengaged, so as to prevent loss of parts. A resilient member may be provided to bias the securing bracket away from the bracket holes when the shaft and rotational lock, are disengaged so that an operator can easily tell that the securing system (and/or power supply) is in an unsecured state.

When the shaft is engaged with the rotational lock, the power supply is secured to the welding cart. While secured, the power supply is restrained from falling off and/or being lifted away from the welding cart. Thus, an operator can be assured that the power supply will stay in place when moving the power supply via the welding cart.

Some examples of the present disclosure relate to a welding cart, comprising a base having a sidewall comprising a bracket hole, the sidewall further comprising a sidewall hole leading to a rotational lock, a shaft extending through the sidewall hole and configured to engage the rotational lock via rotation of the shaft, and a bracket retained on the shaft, the bracket configured to secure a welding-type power supply to the base when the shaft is engaged with the rotational lock and a bracket end of the bracket is received by the bracket hole.

In some examples, the welding cart further comprises a fastener connected to an end of the shaft, the fastener configured to retain at least a portion of the shaft within the rotational lock when the shaft is disengaged from the rotational lock. In some examples, the end of the shaft has an interior channel, and wherein the fastener comprises a fastener head and a fastener shank, the fastener shank being positioned within the interior channel. In some examples, the fastener head is wider than a passageway of the rotational lock, thereby preventing removal of the shaft from the rotational lock.

In some examples, the welding cart further comprises a biasing member configured to bias the bracket end out of the bracket hole when the shaft is disengaged from the rotational lock. In some examples, the biasing member encircles the shaft between the rotational lock and the bracket. In some examples, the shaft is prevented from engaging the rotational lock when the bracket end is out of alignment with the bracket slot. In some examples, the welding cart further comprises an actuator configured to rotate the shaft to induce engagement or disengagement of the shaft and the rotational lock.

Some examples of the present disclosure relate to a system, comprising a welding-type power supply, comprising a housing having a first bracket hole, and a cart configured to retain the welding power supply, the cart comprising a base having a sidewall comprising a second bracket hole, the sidewall further comprising a sidewall hole leading to a rotational lock, a shaft extending through the sidewall hole and configured to engage the rotational lock via rotation of the shaft, and a bracket retained on the shaft, the bracket configured to secure the welding-type power supply to the base when: (a) the shaft is engaged with the rotational lock, (b) a first bracket end of the bracket is received by the first bracket hole, and (c) a second bracket end of the bracket is received by the second bracket hole.

In some examples, the cart further comprises a fastener connected to an end of the shaft, the fastener configured to retain at least a portion of the shaft within the rotational lock when the shaft is disengaged from the rotational lock. In some examples, the end of the shaft has an interior channel, and the fastener comprises a fastener head and a fastener shank, the fastener shank being positioned within the interior channel. In some examples, the fastener head is wider than a passageway of the rotational lock, thereby preventing removal of the shaft from the rotational lock.

In some examples, the cart further comprises a biasing member configured to bias the first bracket end out of the first bracket hole, or the second bracket end out of the second bracket hole, when the shaft is disengaged from the rotational lock. In some examples, the biasing member encircles the shaft between the sidewall hole and the bracket. In some examples, the shaft is prevented from engaging the rotational lock when the bracket end is out of alignment with the bracket slot.

In some examples, the cart further comprises an actuator configured to rotate the shaft to induce engagement or disengagement of the shaft and the rotational lock. In some examples, the rotational lock comprises an insert positioned within the sidewall hole, wherein an internal surface of the insert defines a passageway. In some examples, the insert further comprising a head anchored against the sidewall and a shank extending from the head, the internal surface of the shank defining the passageway.

Figure 1A:
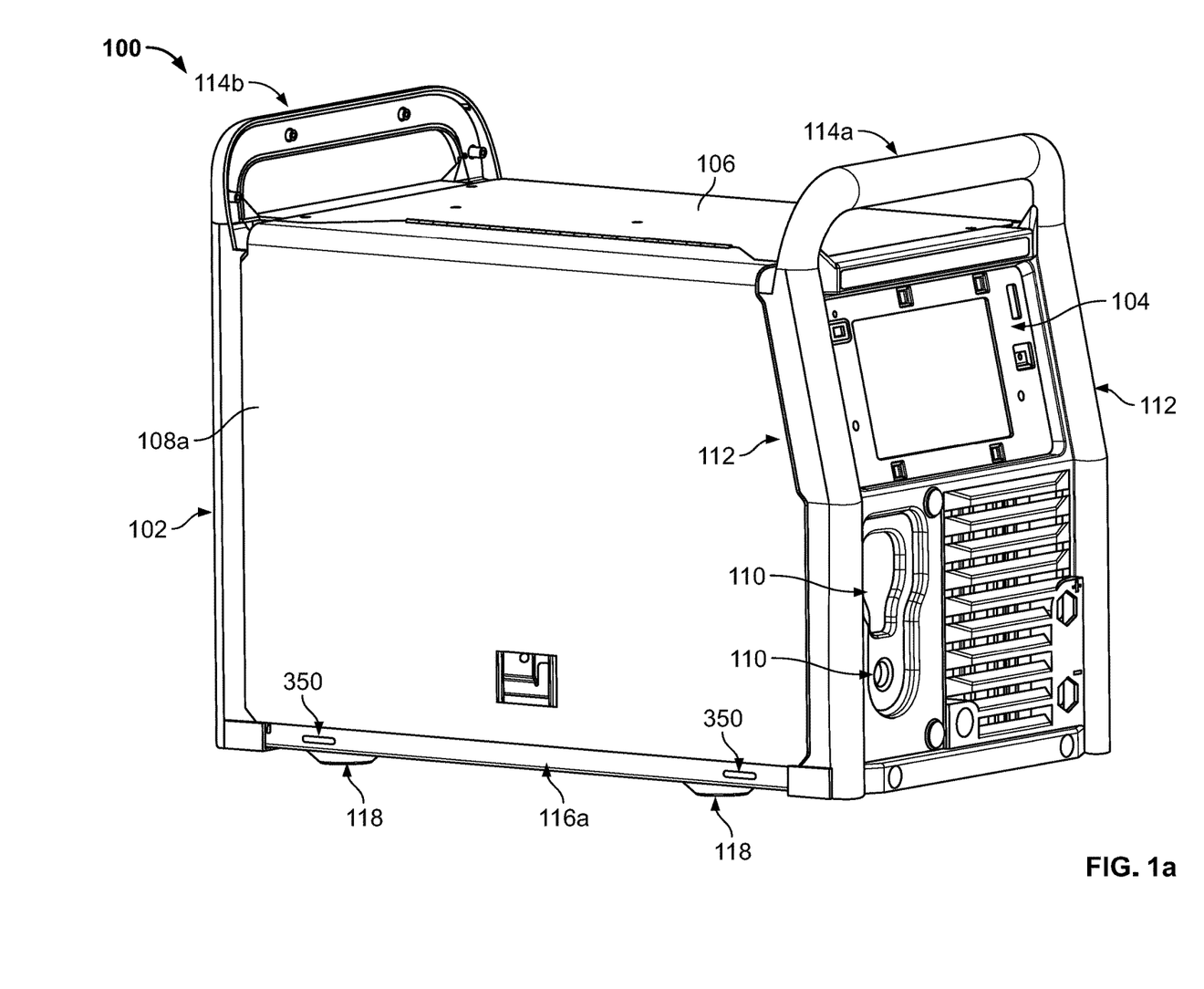
FIGS. 1a-1b are perspective views of an example welding-type power supply, in accordance with aspects of this disclosure.
Figure 1B:
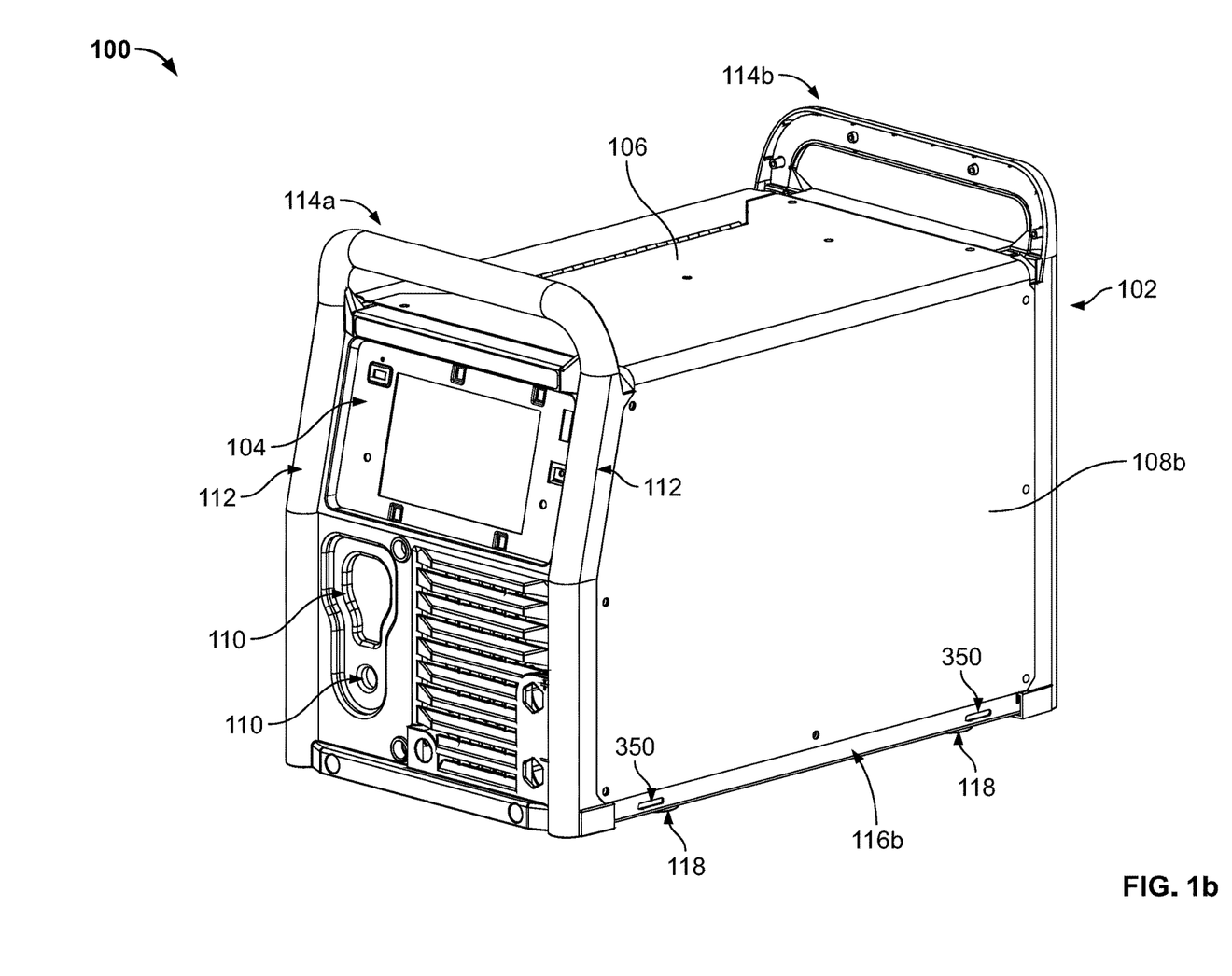

FIGS. 1a-1b show an example welding-type power supply 100. As shown, the power supply 100 includes a housing 102. In some examples, the housing 102 may enclose various electrical components configured to allow the power supply 100 to receive an input power (e.g., from mains power) and convert the input power to a welding-type output power. In some examples, the welding-type output power may be provided to various welding-type equipment (e.g., a welding torch) to perform various welding-type operations.

In the examples of FIGS. 1a-1b, the housing 102 includes a front panel 104, a rear panel (not shown) opposite the front panel 104, a top wall 106, a bottom wall (not shown) opposite the top wall 106, a right sidewall 108a, and a left sidewall 108b opposite the right sidewall 108a. In the examples of FIGS. 1a-1b, the front panel 104 of the power supply 100 includes an operator interface through which an operator may set certain target characteristics of the welding-type power. The front panel 104 further includes sockets 110 configured to receive plugs from welding cables that route power from the power supply 100 to welding equipment.

In the examples of FIGS. 1a-1b, the top wall 106, bottom wall, front panel 104, rear panel, and sidewalls 108 are coupled together to form the approximately rectangular cuboid housing 102. As shown, the housing 102 further includes front stanchions 112 formed where the sidewalls 108 connect to the front panel 104. The front stanchions 112 lead to a front handle 114a of the housing 100, by which the power supply 100 (and/or a welding cart 200 to which the power supply 100 is secured) may be lifted, pushed, pulled, steered, and/or otherwise manipulated by an operator. In the examples of FIGS. 1a-1b, the housing 102 also includes a rear handle 114b, by which the power supply 100 may be lifted, pushed, pulled, steered, and/or otherwise manipulated by an operator.

In the examples of FIGS. 1a-1b, the housing 102 further includes a bezel 116a positioned at the bottom edge of the right sidewall 108a, and a bezel 116b positioned at the bottom edge of the left sidewall 108b. As shown, each bezel 116 includes two bracket holes 350 near the lower corners of the sidewall 108. In some examples, each bezel 116 may have more (e.g., 3, 4, etc) or less (e.g., 1) bracket holes 350. In some examples, the bracket holes 350 may be disposed in the sidewall 108 or other portion of the housing 102, rather than the bezel 116. In some examples, the bracket holes 350 may be configured to receive bracket ends 306 of a securing bracket 302, as discussed further below.

In the examples of FIGS. 1a-1b, protruding feet 118 extend from the bottom wall proximate to the bracket holes 350 of the bezels 116. In some examples, the power supply 100 may include more (e.g., 5, 6, 8) or less (e.g., 1, 2, 3) protruding feet 118. In some examples, the protruding feet 118 may be shaped and/or configured to fit hollow shoes 218 formed in a welding cart 200, as further discussed below.

Figure 2A:
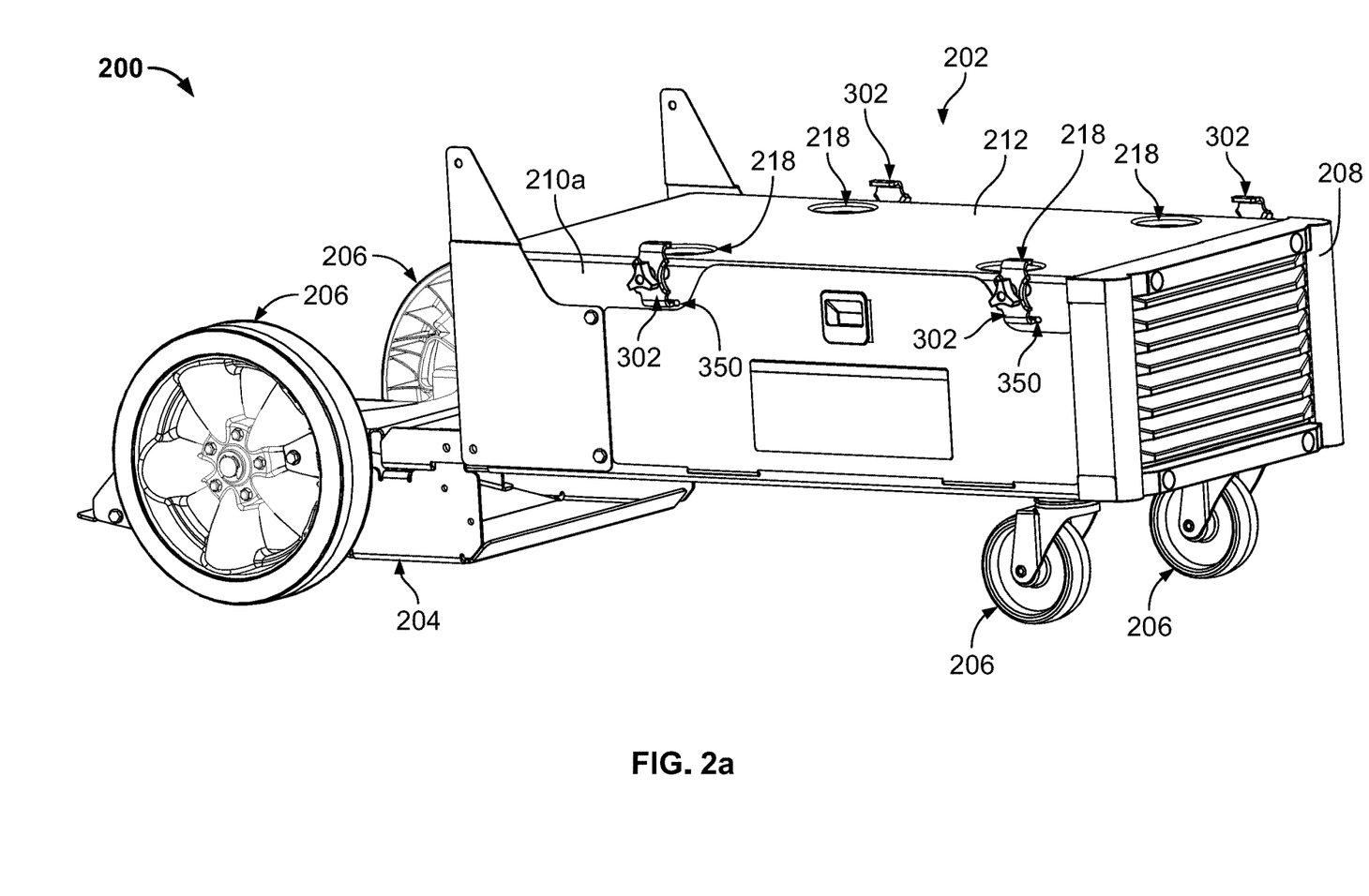
FIGS. 2a-2b are perspective views of an example welding cart, in accordance with aspects of this disclosure.
Figure 2B:
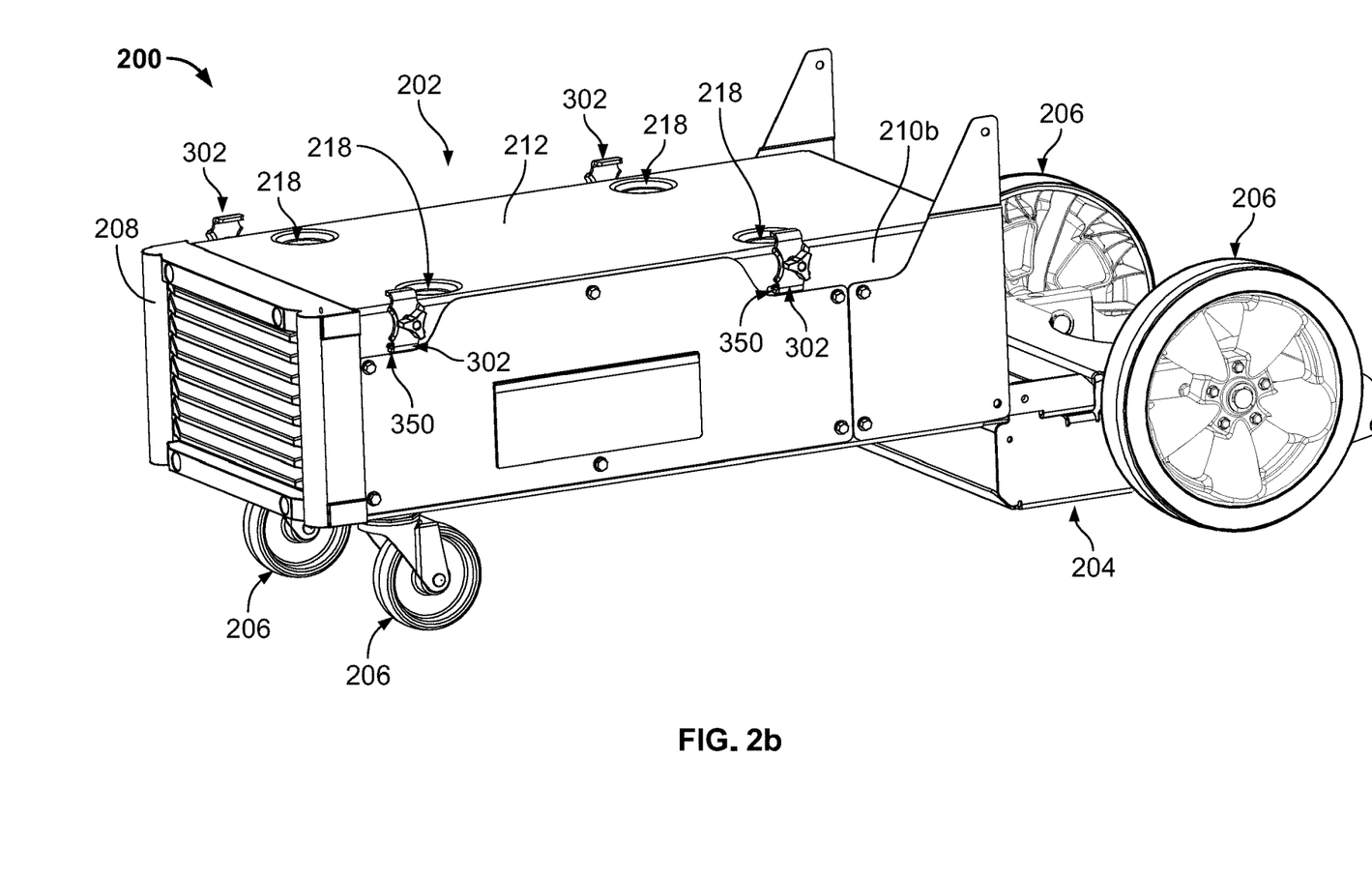
Figure 2C:
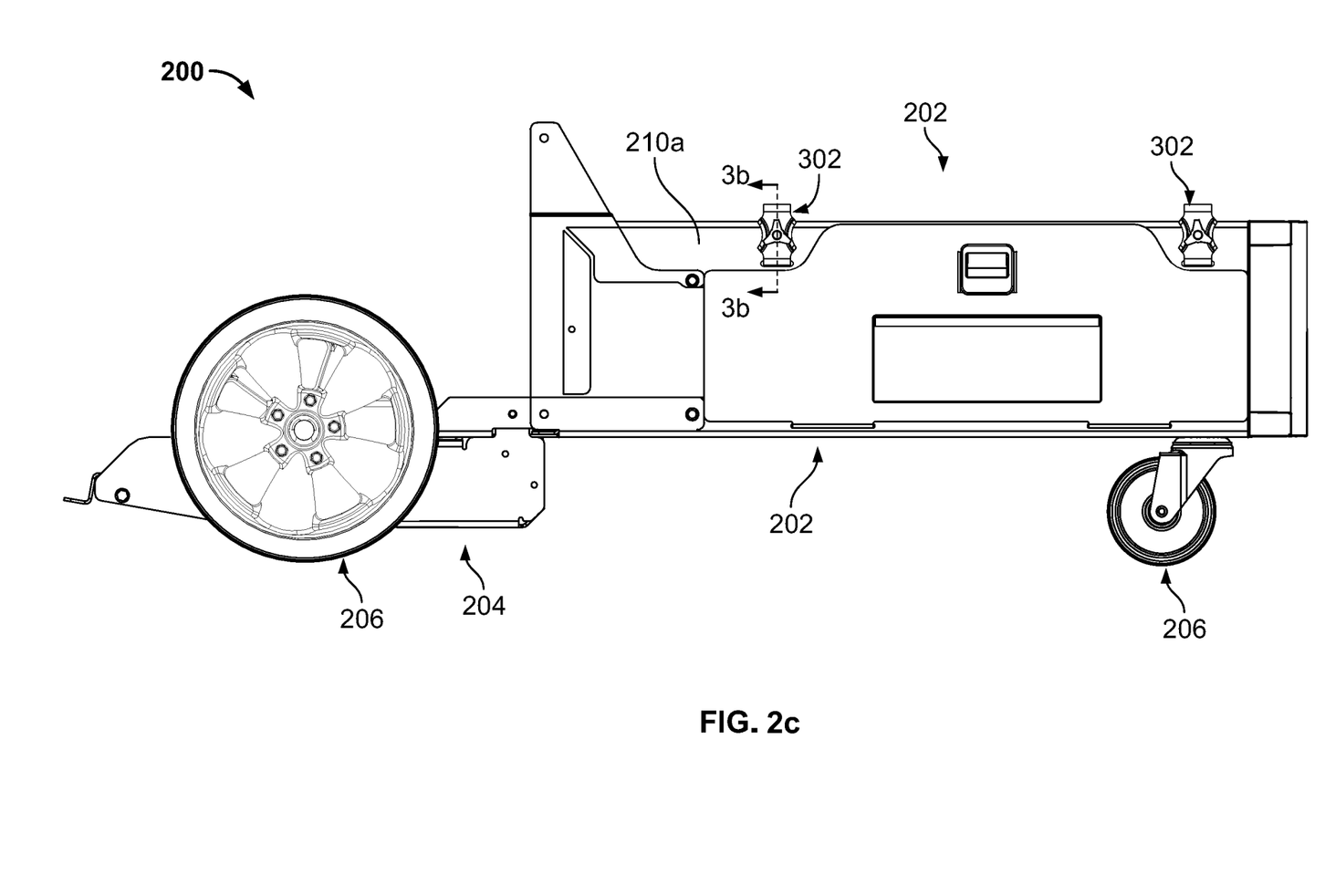
FIG. 2c is a side view of the example welding cart of FIGS. 2a-2b, in accordance with aspects of this disclosure.

FIGS. 2a-2c show an example welding cart 200. As shown, the cart 200 includes a base 202 configured to receive and/or retain the welding-type power supply 100. A bottle support platform 204 is mechanically linked to a rear of the base 202. Wheels 206 are coupled to the bottle support platform 204 and the base 202 to support the welding cart 200 and allow the cart 200 (and/or a retained power supply 100) to be easily moved.

In the examples of FIGS. 2a-2c, the base 202 comprises a front wall 208, a rear wall (not shown) opposite the front wall 208, a right sidewall 210a, a left sidewall 210b opposite the right sidewall 210a, and a top wall 212. In some examples, the base 202 may also include a bottom wall (not shown) opposite the top wall 212. As shown, the front wall 208, rear wall, right sidewall 210a and left sidewall 210b come together to form a generally rectangular cuboid. In some examples, the base 202 may be comprised of a sheet metal material. In some examples, the base 202 may enclose a substantially hollow interior.

In the examples of FIGS. 2a-2c, the top wall 212 of the base 202 comprises a generally flat surface. As shown, hollow shoes 218 are formed in the surface of the top wall 212. While four hollow shoes 218 are shown in the examples of FIGS. 2a-2b, in some examples more (e.g., 5, 6, 7. 8, etc.) or less (e.g., 2, 3) hollow shoes 218 may be formed in the top wall 212. In some examples, the number of hollow shoes 218 and protruding feet 118 may be identical. In some examples, the hollow shoes 218 may be positioned and/or shaped so as to complement and/or accommodate the protruding feet 118 of the power supply 100. In some examples, the protruding feet 118 may be received by the hollow shoes 218 when the power supply 100 is properly positioned on the cart 200. In this way, the protruding feet 118 and/or hollow shoes 218 may be used as alignment surfaces to properly position the power supply 100 on the cart 200.

In some examples, the power supply 100 and/or cart 200 may include different alignment surfaces. For example, the cart 200 may include an angled base 202 with stops positioned around the base 202 to help align the power supply 100. In such an example, gravity may cause the power supply 100 to slide down the base 202 until the power supply 100 encounters the stops, which serve to align the power supply 100 with the cart 200. In some examples, the cart 200 may include one or more posts that may be received by one or more complementary anchors of the power supply 100. The anchors may be comprised of slots, holes, openings, apertures, and/or other appropriate structures. The posts may be formed on and/or attached to the base 202. The anchors may be formed on and/or attached to the power supply 100 (e.g. the sidewalls and/or bottom wall of the power supply 100). In some examples, the power supply 100 may instead include the posts and the cart 200 may include the anchors. In some examples, the posts may join with the anchors when the power supply 100 is positioned on the cart 200, so as to align power supply 100 and the cart 200.

In the examples of FIGS. 2a-2c, the welding cart 200 includes a tool-less securing system comprising four securing brackets 302 captive to the base 202 of the welding cart 200. In particular, FIGS. 2a-2c shows two securing brackets 302 captive to the right sidewall 210a of the base 202, and two securing brackets 302 captive to the left sidewall 210b of the base 202. The tool-less securing system further includes bracket holes 350 on the base 202 proximate to the securing brackets 302. In some examples, the bracket holes 350 of the power supply 100 may also be considered part of the tool-less securing system. In some examples, the tool-less securing system may include more or less securing brackets 302 and/or bracket holes 350.

Figure 3A:
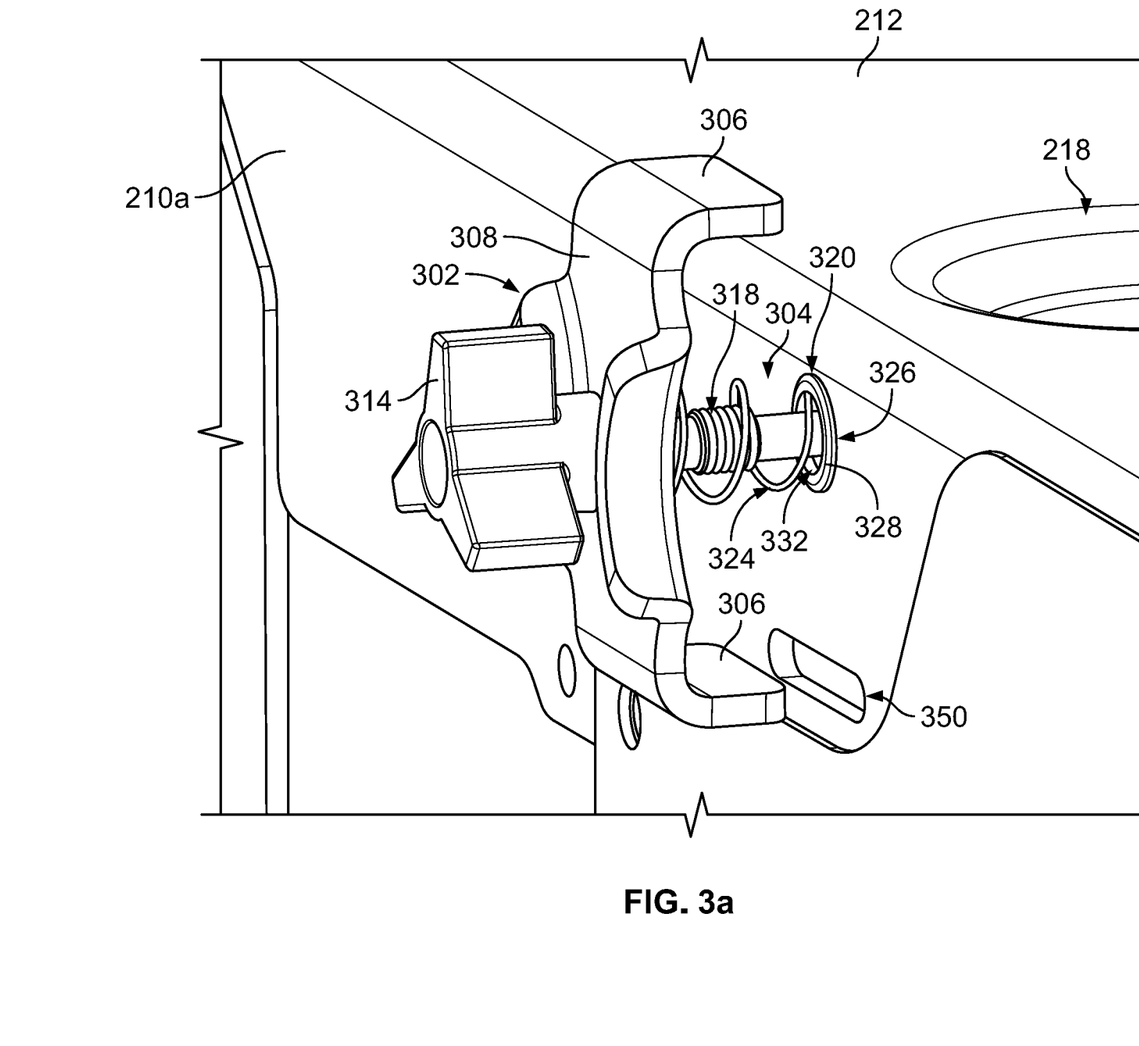
FIG. 3a is a close up perspective view of an example securing bracket of the example welding cart of FIGS. 2a-2b, in accordance with aspects of this disclosure.
Figure 3B:
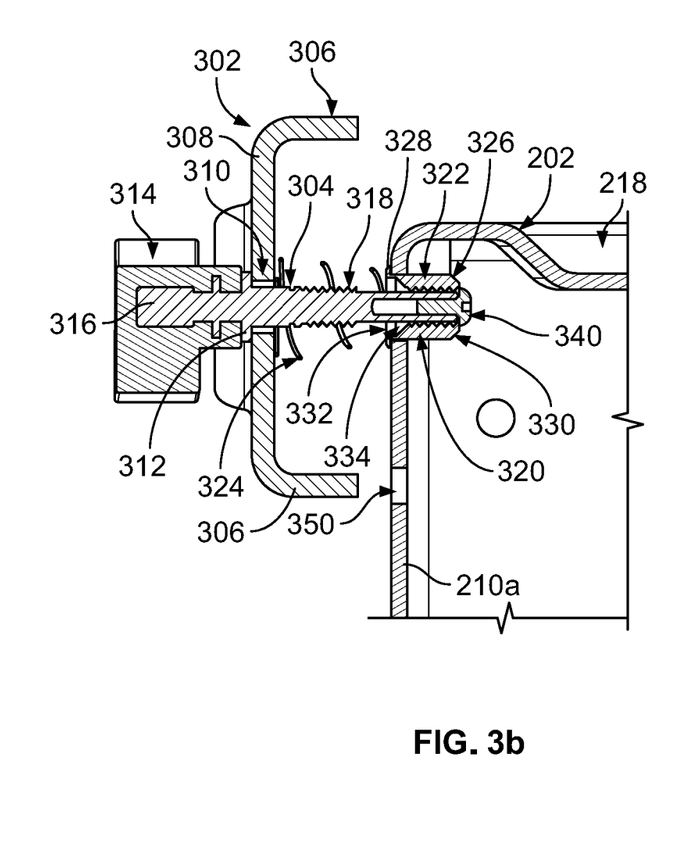
FIGS. 3b-3c are cross-sectional views of an example securing bracket along the line 3b-3b in FIG. 2c, in accordance with aspects of this disclosure.
Figure 3C:
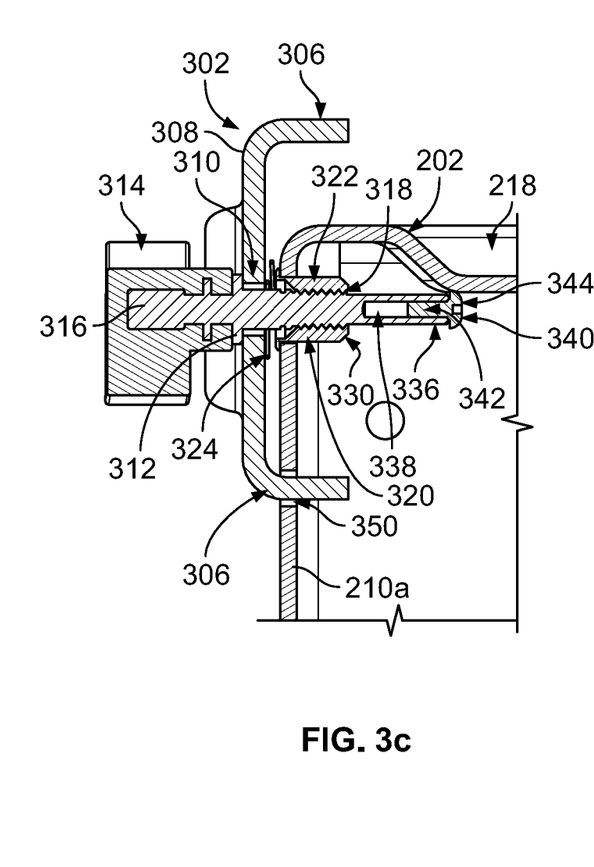

FIGS. 3a-3c show the securing bracket 302 in more detail. In the examples of FIGS. 3a-3c, the securing bracket 302 is coupled to the base 202 via a shaft 304. As shown, the securing bracket 302 has two bracket ends 306 that curve away from a body 308 of the securing bracket 302 at an approximately right angle, to form a C and/or U shape. The securing bracket 302 further includes a bracket opening 310 through which a portion of the shaft 304 extends. As shown, a flange 312 of the shaft 304 that is wider than the bracket opening 310 prevents the bracket 302 from moving farther along the shaft 304 away from the base 202 of the cart 200.

In the examples of FIGS. 3a-3c, an actuator knob 314 is coupled to an end 316 of the shaft 304. In some examples, the actuator knob 314 may be configured to turn the shaft 304 when the actuator knob 314 is turned itself. In some examples, a different actuator may be used instead of the actuator knob 314 (e.g., a wrench). In some examples, the securing bracket 302 may be rotatable about the shaft 304, such that turning the actuator knob 314 and/or the shaft 304 may not necessarily turn the securing bracket 302, and vice versa. Such a configuration may allow an operator to align the bracket ends 306 of the securing bracket 302 with the bracket holes 350 and/or move the bracket ends 306 out of alignment with the bracket holes 350 without turning the shaft 304, and vice versa.

In the examples of FIGS. 3a-3c, the shaft 304 is generally cylindrical, and includes an engaging portion 318 configured to engage with a rotational lock 320 of the tool-less securing system. As shown, the engaging portion 318 includes screw threads configured to engage with a complementary threaded grooves 322 in the rotational lock 320. In some examples, the engaging portion 318 of the shaft 304 may be configured to only engage with the rotational lock 320 when the bracket ends 306 are in alignment with the bracket holes 350.

In the examples of FIGS. 3a-3c, a resilient member 324 encircles the shaft 304 between the securing bracket 302 and the rotational lock 320. As shown, the resilient member 324 is a tapered (and/or conical) spring that has a larger diameter near the securing bracket 302 and a smaller diameter proximate the rotational lock 320. This configuration allows the spring to coil within itself when compressed, thereby taking up a minimal amount of space. In some examples, the resilient member 324 may instead be a compressible material, such as a memory foam or rubber material. In some examples, the resilient member 324 may be a polymer washer or a split lock washer.

In some examples, the securing bracket 302 may be pinched (and/or held in place) between the resilient member 324 and the flange 312 of the shaft 304. This arrangement may prevent lateral movement of the securing bracket 302 along the shaft 304, while still allowing rotational movement of the securing bracket 302 about the shaft 304, such as to align the bracket ends 306 with the bracket holes 350. In some examples, a force (e.g., a spring force) of the resilient member 324 may push (and/or bias) the bracket 302 away from the base 202 and/or out of the bracket holes 350 when the shaft 304 is disengaged from the rotational lock 320. In some examples, when the bracket 302 is disengaged from the rotational lock 320, the resilient member 324 may bias the securing bracket 302 at such a distance that an operator can clearly tell that the bracket 302 is not engaged, and thus that the power supply 100 and cart 200 are not secured together. In some examples, the resilient member 324 may further bias the engaging portion 318 of the shaft 304 away from the rotational lock 320 (e.g., via force applied to the bracket 302) when the shaft 304 is disengaged from the rotational lock 320. In some examples, the resilient member 324 may be compressed between the securing bracket 302 and/or rotational lock 320 (and/or cart 200) when the shaft 304 is engaged with the rotational lock 320.

In the examples of FIGS. 3a-3c, the rotational lock 320 comprises an insert positioned within an aperture 326 of the base 202. In some examples, the insert may comprise a rivet nut. As shown, the rotational lock 320 is substantially cylindrical, with a lock head 328 and a lock shank 330 extending from the lock head 328. The lock head 328 is anchored to the sidewall 210 of the base 202 around the aperture 326. As shown, the diameter of the lock head 328 is wider than the diameter of the aperture 326, such that the lock head 328 is prevented from entering the aperture 326. However, the lock shank 330 is shown as having a diameter that is smaller than the aperture 326, such that the lock shank 330 can extend into the base 202 through the aperture 326.

In the example of FIGS. 3a-3c, an opening 332 in the lock head 328 leads to a passageway 334 defined by an internal surface of the lock shank 330. The internal surface of the lock shank 330 further includes threaded grooves 322 complementary to and configured to engage the screw threads of the engaging portion 318 of the shaft 304. By bringing the engaging portion 318 of the shaft 304 in contact with the complementary engaging portions (e.g., threaded grooves 322) of the rotational lock 320, and then rotating the shaft 304 (e.g., via the knob 314) in the proper engaging direction, the shaft 304 may be put into a locking engagement with the rotational lock 320.

In some examples, the shaft 304 and/or rotational lock 320 may be configured such that an operator need only minimally turn the shaft 304 (e.g., quarter turn, half turn, one full turn, 1.25 turns, 1.5 turns, etc.) to complete the engagement. In some examples, the length of the engaging portion 318 of the shaft 304 and/or the length of the lock shank 330 (and/or threaded grooves 322) may be appropriately configured to induce this functionality. In some examples, other characteristics of the engaging portion 318, lock shank 330, and/or threaded grooves 322 be configured to induce this functionality.

Figure 4:
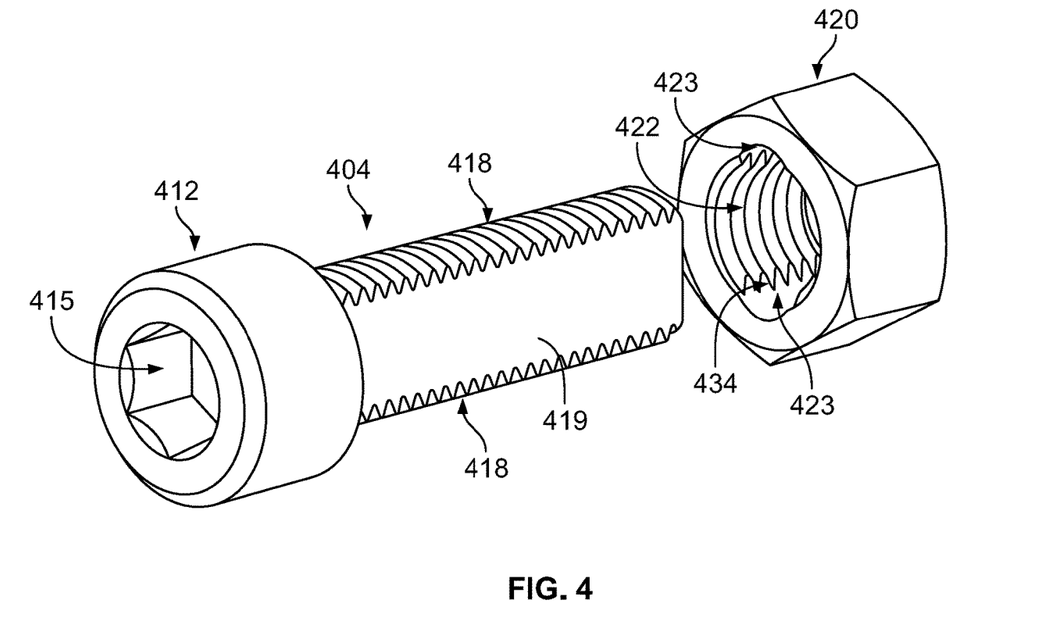
FIG. 4 shows an example of an alternative rotational lock that may be used with the securing bracket of FIGS. 3a-3c, in accordance with aspects of this disclosure.

FIG. 4 shows an example configuration that may ensure only minimal rotation is needed to completely engage a shaft 404 with a rotational lock 420. In the example of FIG. 4, the rotational lock 420 has a passageway 434 with intermittent grooves 422 formed on opposite sides of the passageway 434, separated by smooth portions 423. Meanwhile, the shaft 404 is formed with two engaging portions 418 comprised of intermittent screw threads. The shaft 304 also has flat (non-engaging) portions 419 that separate the engaging portions 418. The passageway 334 similarly is formed with smooth portions 423 that lack any grooves. The passageway 334 has a slightly larger diameter at the smooth portions 423, so as to accommodate the engaging portions 418. In such a configuration, the shaft 304 may be pushed into the passageway with its engaging portions 418 aligned with the smooth portions 423 of the passageway 334, and the flat portions 419 of the shaft 304 aligned with the intermittent grooves 422 of the passageway 434. The shaft 304 may then be fully engaged with the rotational lock 320 via a quarter turn of the shaft 304, such that the engaging portions 418 of the shaft become aligned and/or engaged with the intermittent grooves 424 of the passageway 434.

In the example of FIG. 4, the shaft 420 also has a shaft head 412 with a socket 415 configured to receive an actuator (e.g., an Allen wrench). In some examples, the shaft head 412 may help retain a securing bracket 302, thereby replacing the flange 312. In some examples, an actuator (e.g., the actuator knob 314) may be fixedly coupled to the shaft head 412 at all times. In some examples, an actuator may be coupled to the shaft head 412 only when needed (e.g., via the socket 415), and removed thereafter.

In some examples, the internal surface of the lock shank 330 may have other formations configured to engage with the engaging portion 318 of the shaft 304. For example, a cam lock arrangement may be used instead of screw threads. In some examples, the passageway 334 and/or threaded grooves 322 (and/or other engaging formation(s)) may instead be formed in the base 202 itself, rather than an insert. However, this may result in increased production costs.

In some examples, locking engagement between the shaft 304 and rotational lock 320 may only be possible when at least one of the bracket ends 306 is aligned with the bracket hole 350 in the base 202 of the cart 200. In examples where the power supply 100 is properly positioned on the cart 200, the locking engagement may only be possible when both bracket ends 306 are aligned with both bracket holes 350. In the absence of such an alignment, at least one bracket end 306 may abut a portion of the base 202 (and/or a portion of the power supply 100), preventing movement of the shaft 304 into engagement with the rotational lock 320. However, when the bracket ends 306 are properly aligned, the shaft 304 may engage with the rotational lock 320. In some examples, the bracket ends 306 may be moved into the bracket holes 350 by movement of the shaft 304 into engagement with the rotational lock 320, such as shown in FIG. 3c, for example.

In some examples, the shaft 304 and/or rotational lock 320 may resist lateral movement of the shaft 304 out of the rotational lock 320 when the shaft 304 and rotational lock 320 are engaged. In some examples, when the both bracket ends 306 are in the bracket holes 350, the base 202 and/or bezel 116 defining the bracket holes 350 may abut the bracket ends 306 and resist longitudinal movement of the power supply 100 and/or cart 200 away from one another, thereby securing the power supply 100 to the cart 200.

In the examples of FIGS. 3b-3c, an end portion 336 of the shaft 304 has an interior channel 338 defined by an internal surface of the end portion 336. As shown, a fastener shank 342 of a fastener 340 is positioned within the interior channel 338. In the example of FIGS. 3b-3c, the internal surface of the end portion 336 includes threaded grooves complementary to and configured to engage screw threads on the fastener shank 342. As shown, the fastener shank 342 extends from a fastener head 344 that abuts the end of the shaft 304. The fastener head 344 is wider (and/or with a larger diameter) than the interior channel 338 and the passageway 334.

In some examples, the size of the fastener head 344, as well as the secure coupling of the fastener shank 342 to the shaft 304, ensures that the shaft 304, securing bracket 302, and/or actuator knob 314 remain captive to the base 202 of the cart 200 at all times, thereby preventing potential loss of parts. This can be especially important in examples where the shaft 304 and rotational lock 320 are disengaged and the resilient member 324 biases the securing bracket 302 away from the base 202. In such an example, the fastener 340 provides a maximum limit to which the shaft 304 and/or securing bracket 302 may be biased away from the base 202. At this maximum limit, the fastener head 344 will abut the rotational lock 320, and prevent further movement of the shaft 304 out of the rotational lock 320. Were the fastener 340 not there, the force of the resilient member might push the shaft 304 completely out of the rotational lock 320 when the shaft 304 is disengaged from the rotational lock 320, resulting in potential loss of many of the parts of the tool-less securing system.

While the fastener head 344 may be sufficiently large to prevent removal of the shaft 304 from the rotational lock 320, in some examples, the fastener head 344 may also be sufficiently small to accommodate the proximate hollow shoe 218. In the example of FIGS. 3a-3c, the hollow shoe 218 causes a depression in the base 202 proximate the path of the shaft 304. As shown, the end portion 336 of the shaft 304 extends just below the hollow shoe 218 when the shaft 304 is fully engaged with the rotational lock 320. As such, the fastener head 344 must be small enough to allow the shaft 304 to extend below the depression of the hollow shoe 218 when the shaft is engaged to the rotational lock 320.

In the examples of FIGS. 3b-3c the fastener 340 is a depicted as a bolt or nut. In some examples, the fastener 340 may instead be a C-clip and/or a cotter pin. In some examples, different alignment surfaces may be used which may make the size of the fastener 340 less important.

Figure 5A:
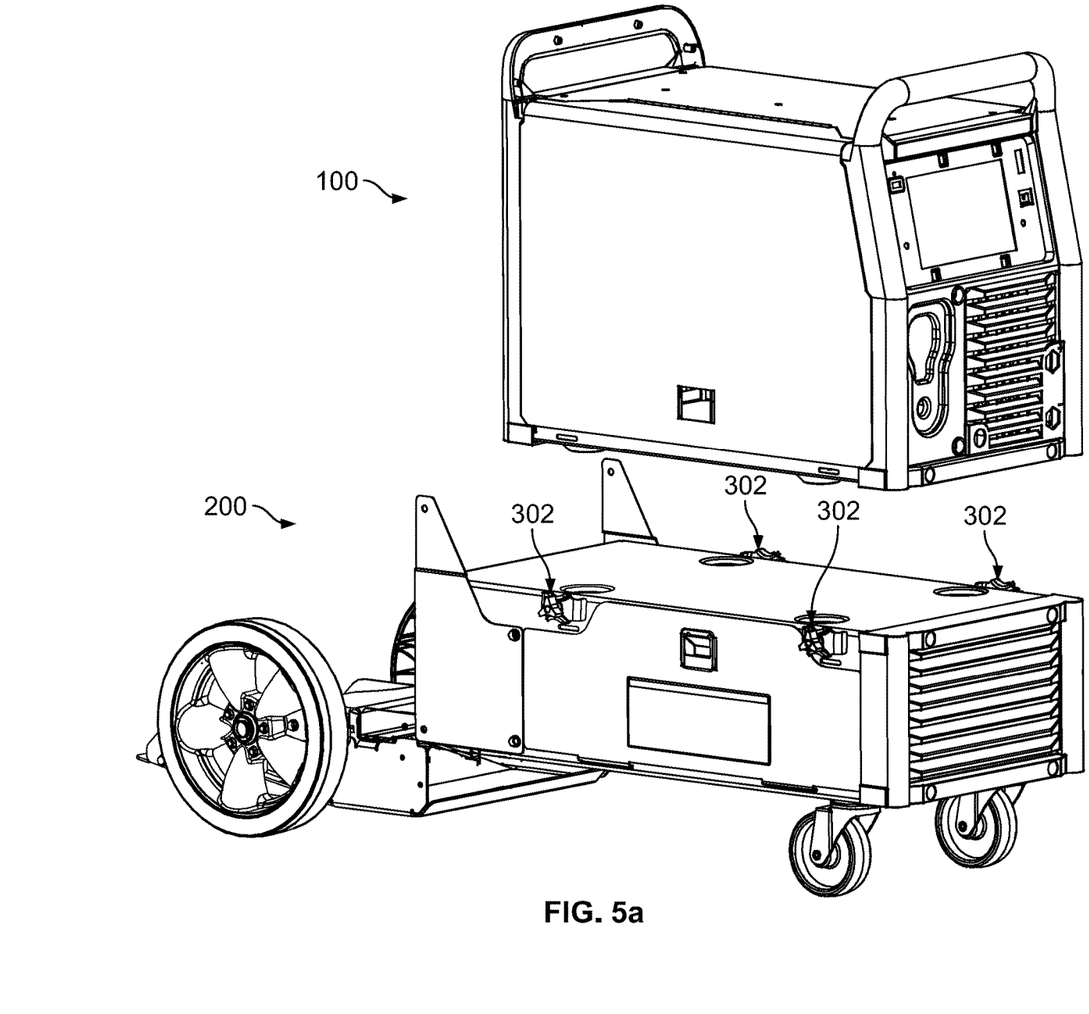
FIGS. 5a-5b are perspective views of the example welding-type power supply of FIGS. 1a-1b and welding cart of FIGS. 2a-2c, in accordance with aspects of this disclosure.

In some examples, an operator may use the above described tool-less securing system when transporting a welding-type power supply 100 on a cart 200. Initially, the operator may rotate the securing brackets 302 out of alignment with the bracket hole 350 in the cart 200, so as to prevent impeding the placement of the power supply 100 on the cart 200. FIG. 5a shows an example of the securing brackets 302 rotated approximately 90 degrees out of alignment prior to placement of the power supply 100 on the cart. Afterwards, the operator may position the power supply 100 on the cart 200. In some examples, the operator may use the alignment surfaces (e.g., hollow shoes 218 and/or protruding feet 118) of the cart 200 and/or power supply 100 to properly position the power supply 100 on the cart 200.

Figure 5B:
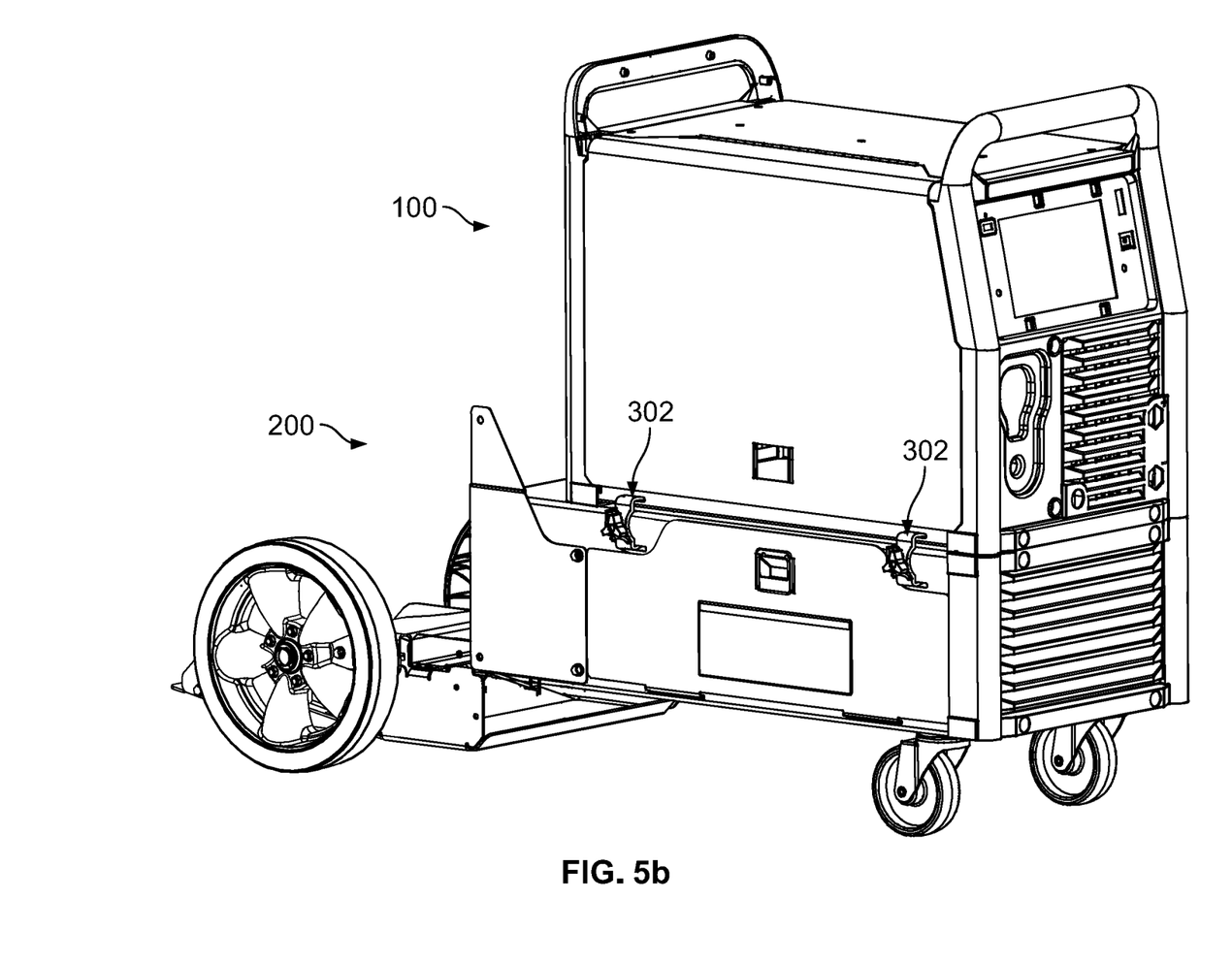
Figure 5C:
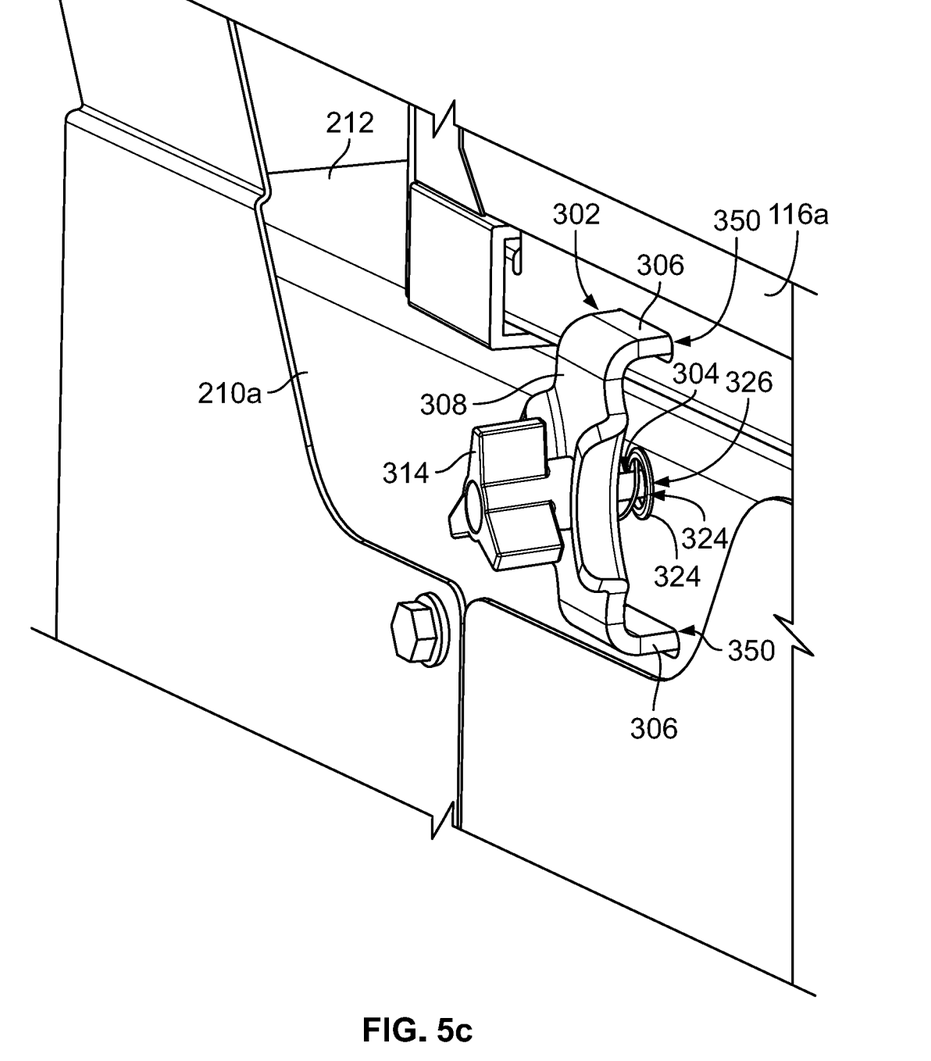
FIG. 5c is a close up perspective view of the example securing bracket of FIGS. 3a-3c securing together the example welding-type power supply of FIGS. 1a-1b and welding cart of FIGS. 2a-2c, in accordance with aspects of this disclosure.

After placement of the power supply 100 on the cart 200, the operator may align the bracket ends 306 with the bracket holes 350 of the power supply 100 and cart 200 and engage the shaft 304 with the rotational lock 320 by turning the knob 314 in the proper direction. FIGS. 5b-5c show examples of the securing bracket 302 in a securing position, with the shaft 304 fully engaged with the rotational lock 320. Once secured, the operator may move the cart 200 and power supply 100 as one unit, such as by pushing the cart 200 via the handles 114 of the power supply 100. If there are obstacles on the ground that an operator wishes to avoid, the operator may steer the cart 200 around the obstacles. Alternatively, or additionally, the operator may lift up the cart 200 to clear an obstacle by lifting the power supply 100 (e.g., via handles 114). In such a situation, the securing brackets 302 may transfer the lifting force of the operator from the power supply 100 to the cart 200, such that the cart 700 is lifted up as well.

After transportation is complete, an operator can disengage the shaft 304 from the rotational lock 320 by actuating the knob 314 in the opposite direction. Once disengaged, a force of the resilient member 324 may automatically push the bracket ends 306 out of the bracket holes 350, without the need for the operator to do so manually. In some examples, the bracket ends 306 may be forced out of the bracket holes 350 with noticeable speed, providing a clear and obvious indication to the operator that the power supply 100 is no longer secured to the cart 200. Thereafter, the power supply 100 may be removed from the cart 200.

The above described tool-less securing system thus allows an operator to easily secure a power supply 100 to (and/or remove the power supply 100 from) a welding cart 200 without the use of any additional tools. Further, the tool-less securing system provides a very clear and obvious indication when the power supply 100 is no longer secured to the welding cart. Additionally, the tool-less securing system provides a means of keeping all the components of the tool-less securing system coupled to the welding cart 200, so as to prevent unintentional loss and/or misplacement of parts.

While the present method and/or system has been described with reference to certain implementations, it will be understood by those skilled in the art that various changes may be made and equivalents may be substituted without departing from the scope of the present method and/or system. For example, components of disclosed examples may be combined, divided, re-arranged, and/or otherwise modified. In addition, many modifications may be made to adapt a particular situation or material to the teachings of the present disclosure without departing from its scope. Therefore, the present method and/or system are not limited to the particular implementations disclosed. Instead, the present method and/or system will include all implementations falling within the scope of the appended claims, both literally and under the doctrine of equivalents.

As utilized herein, "and/or" means any one or more of the items in the list joined by "and/or". As an example, "x and/or y" means any element of the three-element set {(x), (y), (x, y)}. In other words, "x and/or y" means "one or both of x and y". As another example, "x, y, and/or z" means any element of the seven-element set {(x), (y), (z), (x, y), (x, z), (y, z), (x, y, z)}. In other words, "x, y and/or z" means "one or more of x, y and z".

As utilized herein, the terms "e.g.," and "for example" set off lists of one or more non-limiting examples, instances, or illustrations.

The terms "coupled," "coupled to," and "coupled with" as used herein, each mean a structural and/or electrical connection, whether attached, affixed, connected, joined, fastened, linked, and/or otherwise secured. The term "attach" means to affix, couple, connect, join, fasten, link, and/or otherwise secure. The term "connect," means to attach, affix, couple, join, fasten, link, and/or otherwise secure.

The terms "about" and/or "approximately," when used to modify or describe a value (or range of values), position, orientation, and/or action, mean reasonably close to that value, range of values, position, orientation, and/or action. Thus, the embodiments described herein are not limited to only the recited values, ranges of values, positions, orientations, and/or actions but rather should include reasonably workable deviations.

As used herein, a welding-type power supply and/or power source refers to any device capable of, when input power is applied thereto, supplying output power for welding, cladding, plasma cutting, induction heating, laser (including laser welding, laser hybrid, and laser cladding), carbon arc cutting or gouging and/or resistive preheating, including but not limited to transformer-rectifiers, inverters, converters, resonant power supplies, quasi-resonant power supplies, switch-mode power supplies, etc., as well as control circuitry and other ancillary circuitry associated therewith.

Welding-type power, as used herein, refers to power suitable for welding, cladding, plasma cutting, induction heating, CAC-A and/or hot wire welding/preheating (including laser welding and laser cladding), carbon arc cutting or gouging, and/or resistive preheating.

What is claimed is:

1. A welding cart, comprising:
  a base having a sidewall comprising a bracket hole, the sidewall further comprising a sidewall hole leading to a rotational lock, the rotational lock comprising an insert positioned within the sidewall hole, and an internal surface of the insert defining a passageway;
  a shaft extending through the sidewall hole and configured to engage the rotational lock via rotation of the shaft; and
  a bracket retained on the shaft, the bracket configured to secure a welding-type power supply to the base when the shaft is engaged with the rotational lock and a bracket end of the bracket is received by the bracket hole.

2. The welding cart of claim 1, further comprising a fastener connected to an end of the shaft, the fastener configured to retain at least a portion of the shaft within the rotational lock when the shaft is disengaged from the rotational lock.

3. The welding cart of claim 2, wherein the end of the shaft has an interior channel, and wherein the fastener comprises a fastener head and a fastener shank, the fastener shank being positioned within the interior channel.

4. The welding system of claim 3, wherein the fastener head is wider than a passageway of the rotational lock, thereby preventing removal of the shaft from the rotational lock.

5. The welding cart of claim 1, further comprising a biasing member configured to bias the bracket end out of the bracket hole when the shaft is disengaged from the rotational lock.

6. The welding cart of claim 5, wherein the biasing member encircles the shaft between the rotational lock and the bracket.

7. The welding cart of claim 1, wherein the shaft is prevented from engaging the rotational lock when the bracket end is out of alignment with the bracket slot.

8. The welding cart of claim 1, further comprising an actuator configured to rotate the shaft to induce engagement or disengagement of the shaft and the rotational lock.

9. The welding cart of claim 1, the insert further comprising a head anchored against the sidewall and a shank extending from the head, the internal surface of the shank defining the passageway.

10. A system, comprising:
   a welding-type power supply, comprising a housing having a first bracket hole; and
   a cart configured to retain the welding-type power supply, the cart comprising:
      a base having a sidewall comprising a second bracket hole, the sidewall further comprising a sidewall hole leading to a rotational lock, the rotational lock comprising an insert positioned within the sidewall hole, and an internal surface of the insert defining a passageway,
      a shaft extending through the sidewall hole and configured to engage the rotational lock via rotation of the shaft, and
      a bracket retained on the shaft, the bracket configured to secure the welding-type power supply to the base when: (a) the shaft is engaged with the rotational lock, (b) a first bracket end of the bracket is received by the first bracket hole, and (c) a second bracket end of the bracket is received by the second bracket hole.

11. The system of claim 10, wherein the cart further comprises a fastener connected to an end of the shaft, the fastener configured to retain at least a portion of the shaft within the rotational lock when the shaft is disengaged from the rotational lock.

12. The system of claim 11, wherein the end of the shaft has an interior channel, and the fastener comprises a fastener head and a fastener shank, the fastener shank being positioned within the interior channel.

13. The system of claim 12, wherein the fastener head is wider than a passageway of the rotational lock, thereby preventing removal of the shaft from the rotational lock.

14. The system of claim 10, wherein the cart further comprises a biasing member configured to bias the first bracket end out of the first bracket hole, or the second bracket end out of the second bracket hole, when the shaft is disengaged from the rotational lock.

15. The system of claim 14, wherein the biasing member encircles the shaft between the sidewall hole and the bracket.

16. The system of claim 10, wherein the shaft is prevented from engaging the rotational lock when the bracket end is out of alignment with the bracket slot.

17. The system of claim 10, wherein the welding cart further comprises an actuator configured to rotate the shaft to induce engagement or disengagement of the shaft and the rotational lock.

18. The system of claim 11, the insert further comprising a head anchored against the sidewall and a shank extending from the head, the internal surface of the shank defining the passageway.

19. A welding cart, comprising:
   a base having a sidewall comprising a bracket hole, the sidewall further comprising a sidewall hole leading to a rotational lock;
   a shaft extending through the sidewall hole and configured to engage the rotational lock via rotation of the shaft, an end of the shaft having an interior channel;
   a fastener comprising a fastener head and a fastener shank, the fastener shank being positioned within the interior channel at the end of the shaft, the fastener being configured to retain at least a portion of the shaft within the rotational lock when the shaft is disengaged from the rotational lock; and
   a bracket retained on the shaft, the bracket configured to secure a welding-type power supply to the base when the shaft is engaged with the rotational lock and a bracket end of the bracket is received by the bracket hole.

20. The welding cart of claim 19, wherein the fastener head is wider than a passageway of the rotational lock, thereby preventing removal of the shaft from the rotational lock.

* * * * *